United States Patent [19]
Vannerson et al.

[11] Patent Number: 6,163,328
[45] Date of Patent: Dec. 19, 2000

[54] HIGH FREQUENCY RF DRIVER

[75] Inventors: Eric Frank Vannerson, Phoenix, Ariz.; Wm Keith Baker, Belfountain; Sotos Michael Theodoulou, Bramalea, both of Canada

[73] Assignee: Xerox Corporation, Stamford, Conn.

[21] Appl. No.: 09/187,371

[22] Filed: Nov. 6, 1998

[51] Int. Cl.[7] .................................................... B41J 2/415
[52] U.S. Cl. .......................... 347/128; 331/74; 361/235
[58] Field of Search .......................... 347/128; 361/235; 363/20, 21; 331/111, 112, 74, 116 R

[56] References Cited

U.S. PATENT DOCUMENTS

| | | | |
|---|---|---|---|
| 4,562,413 | 12/1985 | Mishiro et al. | 331/17 X |
| 4,841,313 | 6/1989 | Weiner | 346/159 |
| 5,025,273 | 6/1991 | Bowers | 347/128 |
| 5,113,116 | 5/1992 | Wilson | 310/316 |
| 5,142,248 | 8/1992 | Theodoulou et al. | 331/46 |
| 5,359,180 | 10/1994 | Park et al. | 219/121.54 |
| 5,574,326 | 11/1996 | Chiba et al. | 310/323 |
| 5,587,630 | 12/1996 | Dooley | 315/209 |
| 5,629,761 | 5/1997 | Theodoulou et al. | 399/307 |

*Primary Examiner*—Joan Pendegrass
*Attorney, Agent, or Firm*—William F. Eipert

[57] ABSTRACT

A device for providing an RF signal burst to an external load includes a voltage-controlled oscillator to generate a drive signal having a frequency $f_{VCO}$ fixed by an oscillator control signal. An RF driver stage coupled to the external load receives the drive signal and generates an RF signal burst in response to the drive signal. A current transformer coupled between the RF driver stage and the external load senses the current in the RF driver stage and generates a reference current having the same phase as the sensed current. A phase detector receives the reference current along with the drive signal and generates a phase detection signal that provides a measure of the phase of the current in the RF driver stage with respect to the drive signal. The phase detection signal can be used to adjust the oscillator control signal to drive the oscillator frequency to a desired value.

19 Claims, 5 Drawing Sheets

HIGH FREQUENCY RF DRIVER

BACKGROUND OF THE INVENTION

(1) Field of the Invention

The present invention relates to a device for generating high frequency, high voltage RF signals, and more particularly, to an RF driver for providing high frequency, high voltage RF signals having well-defined envelopes and controlled amplitudes.

(2) Description of the Related Art

In systems for electron beam imaging and ion deposition printing, a print head having several closely spaced RF electrodes with a number of overlapping, transverse electrodes (called fingers) is commonly used to deposit charges on an imaging medium. Exciting the RF electrodes with high-voltage RF signals causes plasma to be formed at the intersection of the RF electrode and a finger. The potential of a finger determines whether charge is deposited on the imaging medium. The charge deposited on the imaging medium forms a latent image that can then be used to retain toner for transfer to a permanent recording medium such as paper. By controlling the application of the high voltage RF signals along with the potential of the fingers, a specific pattern of charges can be deposited on the imaging medium.

The accuracy and speed with which the pattern of charges is deposited upon the imaging medium depends, in part, upon the accuracy of the timing, duration and amplitude of the RF signals energizing the electrodes. To ensure proper deposition of charges, the RF driver must generate RF signals having an amplitude within a specified range for a specific ionization period. RF signals that are less than full amplitude or have a duration which is less than the ionization period are ambiguous as to the amount of ionization, if any, that they contribute and thus do not guarantee proper charge deposition. Therefore, the portions of RF signals that are less than full amplitude, such as the rise to, and the fall from the desired amplitude, should be eliminated or minimized. Furthermore, sharply defining the RF signal bursts in terms of both the rise to, and the fall from the desired voltage, enables the bursts to be applied in a more rapid succession.

In existing systems for electron beam imaging and ion deposition printing, the driver used to generate RF signal bursts is typically a resonant circuit formed by the secondary inductance of a step-up transformer and the load capacitance of the RF line in the print head. The primary of the transformer is initially driven with an arbitrarily wide current pulse in order to charge the output capacitance on the secondary side which, in turn, results in oscillatory ringing of the secondary resonant tank circuit. With this type of driver, the initial drive pulse must be made large in order to provide an output bounded by a square envelope at startup. Feedback of the secondary voltage (or the reflected primary voltage) is then used to provide subsequent drive pulses to the transformer primary. These drive pulses occur at the resonant frequency and have the correct phase relationship with the secondary voltage in order to sustain oscillation.

While existing drivers provide RF signals having well defined envelopes and controlled amplitudes, they generally suffer from one or more drawbacks that limit the applications with which they can be used. One such drawback is that the operating frequency of the driver depends not only upon the inductance of the step-up transformer secondary and the RF electrode capacitance, but also upon the signal delay through the feedback network and associated control logic. The accumulated delay through the feedback network and control logic, which often is relatively large, makes it difficult to ensure operation near resonance, particularly with designs operating at higher frequencies.

Another drawback associated with existing RF drivers is the design of the step-up transformer. The step-up transformer is designed to provide a high voltage output signal while maintaining a (typically small) secondary inductance selected to ensure resonance at the desired operating frequency. The large air gap required in the core of the transformer to set the secondary inductance may lead to a large leakage inductance. This leakage inductance increases parasitic ringing in the driver as the primary current is switched and leads to EMI problems and complicates design of the feedback circuit. This drawback is further magnified by the trend to higher operating frequencies with large capacitive loads, which makes the design of the traditional transformer impractical.

Some examples of existing systems can be found in U.S. Pat. No. 4,841,313 to Weiner and U.S. Pat. No. 5,142,248 to Theodoulou et al. Portions of these examples may be briefly summarized as follows:

U.S. Pat. No. 4,841,313 discloses an RF drive network for providing RF power to an external load. The RF drive network includes a voltage to current amplifier fed by a power one-shot which triggers on a zero crossing feedback signal from the drive line.

U.S. Pat. No. 5,142,248 discloses an oscillation circuit having multiple separately addressable oscillator stages for applying RF voltage across capacitive loads. Each stage includes a power driver, a transformer, and a quench circuit. A stage is activated by providing an initial pulse of AC current through the transformer primary. A common feedback circuit coupled to each of the transformers detects negative zero crossovers of the current through the transformer primary to maintain actuation of the driver.

SUMMARY OF THE INVENTION

In accordance with one aspect of the present invention, there is provided an RF driver for providing an RF signal to an external load. The device employs a voltage-controlled oscillator to generate a drive signal having a frequency $f_{VCO}$ that is controlled by an oscillator control signal. The drive pulses are directed to an RF driver stage coupled to the external load. The RF driver stage generates an RF signal burst in response to the received drive signal. A current transformer coupled between the RF driver stage and the external load senses the current in the RF driver stage and generates a reference current having the same phase as the sensed current. A phase detector receives the reference current along with the drive signal and generates a phase detection signal that provides a measure of the phase of the current in the RF driver stage with respect to the drive signal. The phase detection signal is coupled to a controller and used as a feedback signal to adjust the oscillator control signal to drive the oscillator frequency to a desired value.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals and symbols designate identical or corresponding parts throughout the several views and wherein.

DETAILED DESCRIPTION OF THE INVENTION

Figure 5:
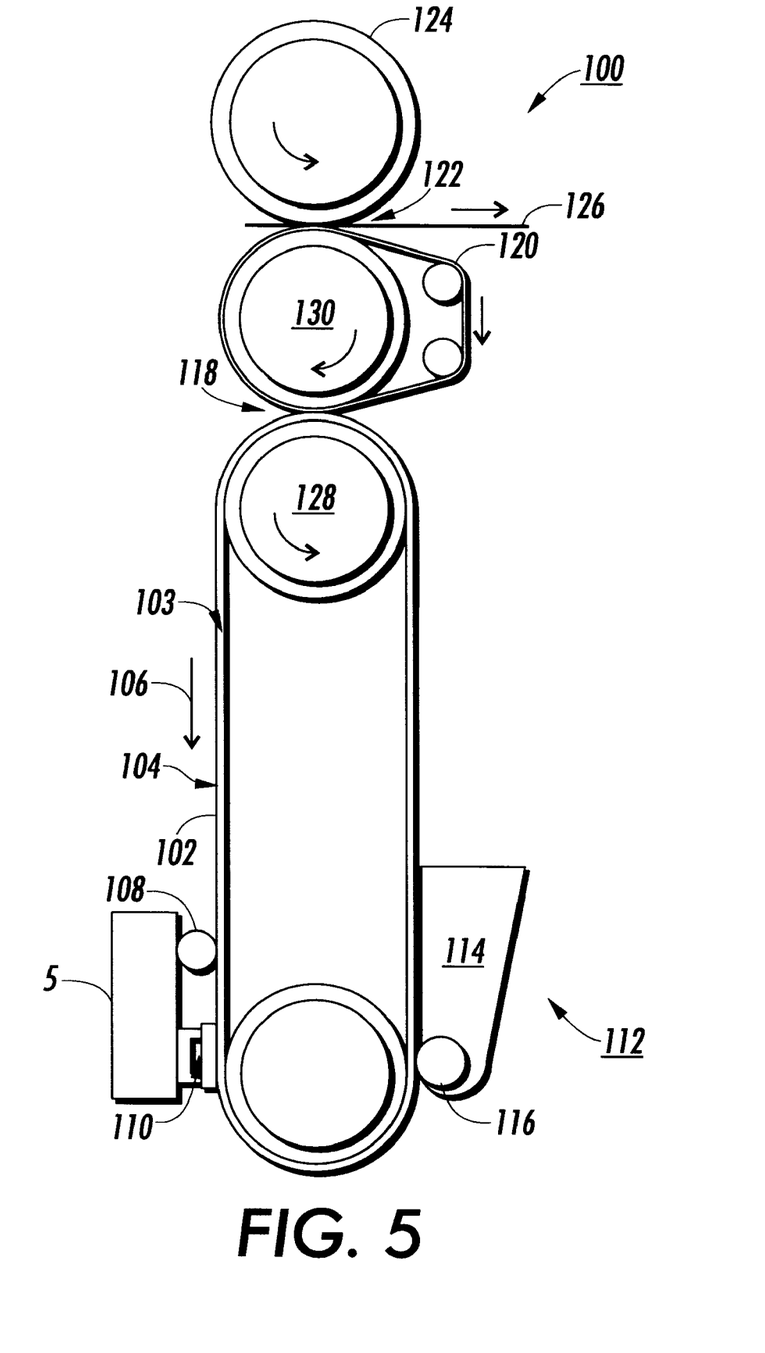
FIG. 5 shows a block diagram of an exemplary printing machine which may incorporate the features of the present invention therein.

To begin by way of general explanation, FIG. 5 shows the basic elements of a printing machine which may incorporate the features of the present invention therein. It will be apparent from the following discussion that the present invention is equally well suited for use in a wide variety of printing machines and is not limited to the particular system shown here. As shown in FIG. 5, printer 100, such as an electrographic printer, includes a first imaging member 102, shown in the form of a belt, having a conductive substrate 103 and an electrostatically chargeable dielectric layer on its surface 104 to receive and hold a latent charge image. At the beginning of the ionographic process, imaging belt 102 travels in the direction of arrow 106 past a biased corona rod 108 which establishes a uniform or null level of charge on the belt surface 104.

Imaging belt 102 continues past a charge deposition print head 110 having several closely spaced RF electrodes with a number of overlapping 'finger' electrodes. Surface 104 of belt 102 is charged in image-wise fashion by electrons emitted from print head 110. RF drive network 5 (as described in greater detail in FIGS. 1 through 4) provides RF voltage to individual RF electrodes within the print head. The image-wise deposition of electrons on the moving belt 102 is caused by selectively exciting the electrodes within print head 108 while simultaneously controlling the potential of the fingers. By coordinating the deposition of electrons with the motion of belt 102, a desired electrostatic latent image of text, graphics or the like can be formed.

Upon receiving an electrostatic latent image, imaging belt 102 advances through developing station 112 at which toner is placed on the latent image using commonly known techniques. For example, development station 112 may be of a type generally referred to in the art as magnetic brush development units. Magnetic brush developer 114 employs a magnetic brush 116 which brings a thin layer of toner into proximity with surface 104 of imaging belt 102 causing the toner to selectively adhere to the charged areas of the latent image forming a toner image upon the belt.

After receiving the developed toner image, imaging belt 102 carries it to a nip 118 formed between belt 102, and a second member 120, which is also shown as a belt. At nip 118, the developed toner image is transferred to member 120, which then carries it around to a second nip 122 formed between member 120 and pressure roll 124. At nip 112, the image is transferred a second time, from the intermediate member 120 to a recording substrate 126, such as a sheet of paper. Drive rolls 128, 130, move synchronously and define a precise nip where the respective belts 102, 120 contact. Similarly, pressure roll 124 may be driven synchronously with roll 130. It will be understood that one or more of the rolls may be an idler roll driven by contact with the opposing sheet, belt or drum. A detailed description of electrographic printers can be found in U.S. Pat. No. 5,629,761 to Theodoulou et al., the relevant portions of which are hereby incorporated by reference herein.

Figure 1:
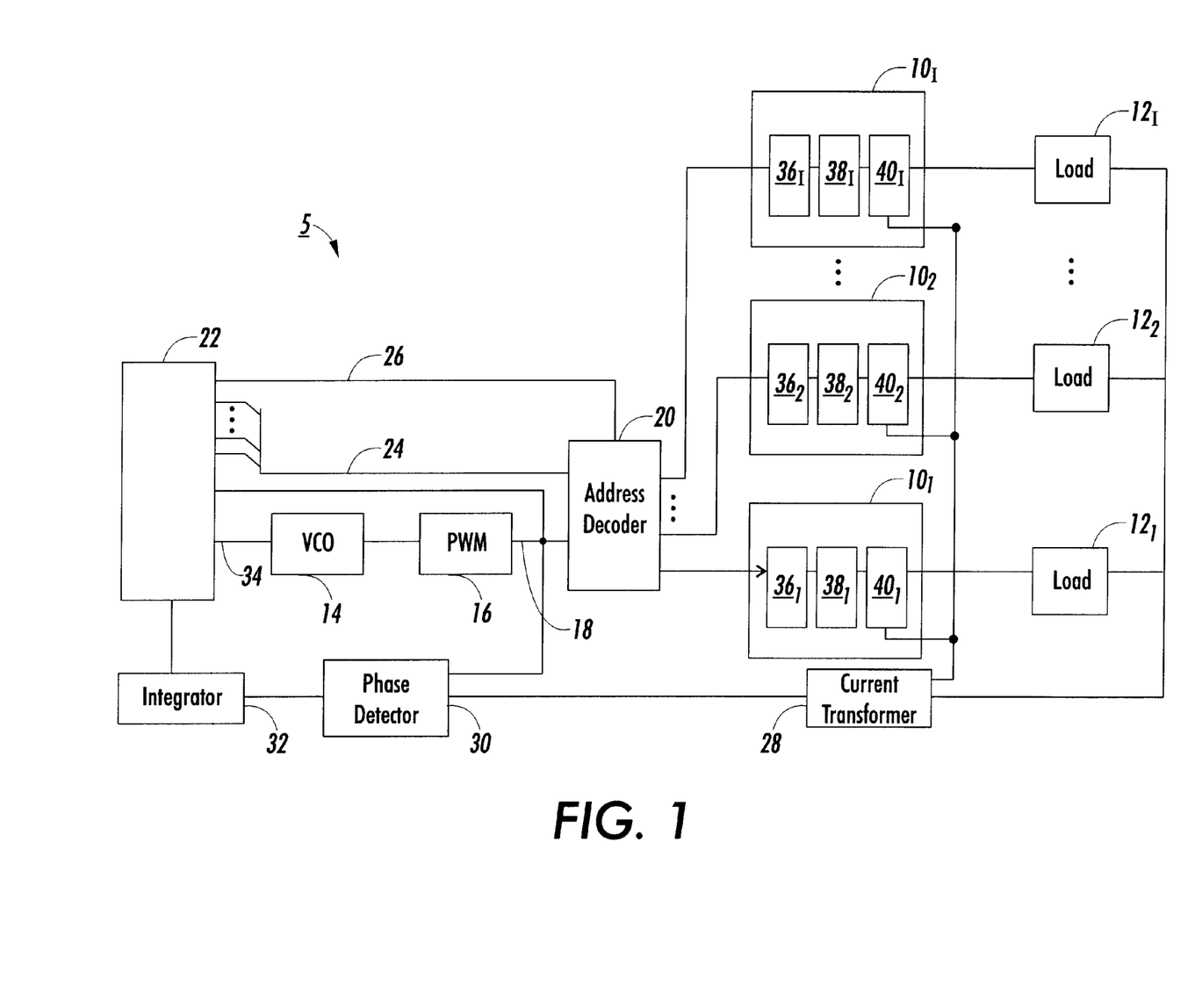
FIG. 1 is a block diagram of a multiple output, high frequency RF driver network in accordance with the present invention.

Referring to FIG. 1, there is shown a block diagram of a multiple output, high frequency RF driver 5 in accordance with the present invention. In the multiple output RF driver, the circuit components unique to each individual load are referred to as an RF driver stage. RF driver 5 is shown comprising N independent RF driver stages $10_1$ through $10_i$. Each RF driver stage, generally identified as RF driver stage $10_i$, is coupled to an associated external, capacitive load $12_i$ and, when enabled, provides an RF signal burst to that load.

RF driver 5 uses voltage-controlled oscillator 14 coupled to pulse-width modulator 16 to generate drive signal 18 that is directed to decoder 20. Controller 22 selects a specific RF driver stage $10_i$ to generate an RF burst by generating an address signal 24 that is coupled to decoder 20. In response to address signal 24 and an enable signal 26, decoder 20 couples drive signal 18 to the RF driver stage $10_i$ whose address corresponds to address signal 24. In response to drive signal 18 from decoder 20, RF driver stage $10_i$ provides an RF signal burst to its associated load $12_i$. A shared feedback network comprising current transformer 28, phase detector 30 and integrator 32, provides controller 22 with a measure of the difference between the frequency of oscillator 14 and the resonant frequency of the circuit defined by an enabled RF driver stage $10_i$ and its associated load $12_i$. Controller 22 uses the frequency difference to drive oscillator 14 such that the oscillator frequency equals the resonant frequency.

More specifically, voltage-controlled oscillator (VCO) 14 generates an oscillator output in response to control signal 34 generated by controller 20. The output frequency, $f_{VCO}$, of the oscillator is determined by the value of control signal 34 and can be precisely controlled by adjusting the value of control signal 34 coupled to the oscillator. The oscillator output is coupled to pulse-width modulator 16 which varies the duty cycle of the oscillator output to produce a drive signal having a precisely controlled pulse width independent of the output frequency, $f_{VCO}$, of VCO 14. That is, modulator 16 produces drive signal 18 comprising a series of drive pulses having the same frequency, $f_{VCO}$, as the oscillator output with a controlled pulse width determined by modulator 16.

It should be appreciated by those skilled in the art that, while modulator 16 varies the duty cycle of the output of VCO 14 to produce a drive signal having a controlled pulse width independent of the frequency $f_{VCO}$, the modulator would have to be tailored for the operating frequency range expected. Modulator 16 can be preset to produce drive signals having a constant pulse width or can respond to an external control signal to dynamically vary the pulse width. Drive signal 18 produced by pulse-width modulator 16 is coupled to decoder 20 as well as phase detector 30 and controller 22.

Address decoder 20 receives drive signal 18 from modulator 16 and operates to pass the drive signal to a selected RF driver stage $10_i$ in response to address signal 24 and enable signal 26 from controller 22. Address signal 24 supplied to decoder 20 has a sufficient number of bits to uniquely identify each of the N RF driver stages. Decoder 20 is responsive to address signal 24 to couple drive signal 18 to the selected (addressed) RF driver stage. Decoder 20 responds to enable signal 26 to gate drive signal 18 such that the decoder only passes the drive signal to the selected RF driver stage when the enable signal is active.

In response to drive signal 18, RF driver stage $10_i$ provides an RF signal burst to its associated external load $12_i$. To generate the RF signal bursts, each RF driver stage $10_i$ employs power driver $36_i$, step-up transformer $38_i$ and resonant inductor $40_i$. Power driver $36_i$, which is coupled to the primary of transformer $38_i$, provides a controlled current path through the transformer. Resonant inductor $40_i$, which is coupled across the secondary of transformer $38_i$, provides a controlled inductance at the secondary that resonates with external load $12_i$ at the desired operating frequency. External load $12_i$, which is also coupled across the secondary of transformer $38_i$, forms a circuit having a resonant frequency $f_{res}$ defined by the capacitance of the load and the equivalent inductance of the transformer secondary and resonant inductor parallel combination. The inclusion of resonant inductor $40_i$ allows step-up transformer $38_i$ to comprise a low leakage, high magnetizing inductance transformer while maintaining a controlled inductance that ensures oscillation with an external load at the desired operating frequency.

Unlike prior art self-oscillating drivers in which a drive signal was derived from a feedback signal of the power driver or secondary circuit, the present invention uses a drive signal 18 that is the output of a free-running oscillator. As previously indicated, drive signal 18 comprises a series of drive pulses. Power driver $36_i$ is responsive to these drive pulses to draw current through the primary of the step-up transformer $38_i$ for each drive pulse received. For efficient operation, the frequency $f_{VCO}$ of the drive pulses (drive signal 18) should match the resonant frequency $f_{res}$ such that the current drawn through the primary of transformer $38_i$ reinforces the natural oscillation of the resonant circuit.

Driver network 5 includes a common return path from each of the external loads to their respective RF driver stages through current transformer 28. Current transformer 28 senses the total resonant current in the resonant secondary circuit and generates a reference current having the same phase as the resonant current. It should be appreciated that the currents in resonant inductor $40_i$ and the secondary of transformer $38_i$ are substantially in phase (finite resistive components in resonant inductor $40_i$ and the secondary of transformer $38_i$ will lead to small phase differences) and that a majority of the total resonant current flows through the small valued resonant inductor. Thus, the reference current generated by current transformer 28 provides an accurate measure of current in the resonant inductor $40_i$.

Phase detector 30 receives the reference current generated by current transformer 28 along with the train of drive pulses 18 and generates a phase detection signal for the current in resonant inductor $40_i$. The phase detection signal provides a measure of the phase of current in resonant inductor $40_i$ during the application of a drive pulse to RF drive stage $10_i$. The phase detection signal is coupled to integrator 32 where the detection signal is integrated and converted into a digital phase error value. The digital phase error value is passed to controller 22 which uses this value as a feedback signal to adjust the value of control signal 34 to drive the VCO frequency $f_{VCO}$ to equal the resonant frequency $f_{res}$.

Controller 22 directs the application of oscillator control signal 34 to VCO 14 along with address signal 24 and enable signal 26 to control the application of high-voltage RF signal bursts to the external loads. For example, in electron beam imaging, driver network 5 is coupled to a print head such that each RF electrode within the print head comprises an external load $12_i$. With this arrangement, controller 22 controls the application of the high-voltage RF signal bursts to the RF electrodes such that specific charges are deposited on the imaging medium. By repeatedly generating distinct address signals for specific RF drivers stages $10_i$ at the correct times and for the proper duration a specific pattern of charges can be generated to form a desired latent image.

For each RF signal burst to be generated, controller 22 generates an address signal 24 for a specific RF driver stage $10_i$ and an enable signal 26 and provides control signal 34 to voltage-controlled oscillator 14. For each new address signal 24 generated, controller 22 resets control signal 34 to a reference control signal value associated with the specific RF driver stage $10_i$ addressed. Controller 22 supplies the reset control signal 34 to VCO 14 and address signal 24 to decoder 20. Controller 22 then activates enable signal 26 and begins to count the number of drive pulses passed to decoder 20. Enable signal 26 remains active for a metered number of drive pulses required to deposit charges on the imaging medium.

During the application of enable signal 26 to decoder 20, the value of control signal 34 is regulated by controller 22 in response to the phase error value from integrator 32 to drive $f_{VCO}$ to equal $f_{res}$. After the number of drive pulses required to deposit charges on the imaging medium have been passed to decoder 20, controller 22 removes (inactivates) enable signal 26. Upon removal of enable signal 26 from address decoder 20, controller 22 uses the current value of control signal 34 driving VCO 14 to update the reference control signal value associated with the currently addressed RF driver stage $10_i$. By maintaining the reference control signal values in the above manner, controller 22 ensures that the VCO frequency $f_{VCO}$ is equal to or is quickly driven to the resonant frequency $f_{res}$ of the electrode, thereby maintaining efficient operation and providing a quick rise to the desired operating voltage.

As should be apparent to one skilled in the art, other methods may be employed to adjust the value of control signal 34. For example, controller 22 may update control signal 34 after every x cycles of an RF burst, rather than after every cycle. Furthermore, controller 22 may not update control signal 34 at all and only update the reference control signal value after the end of the RF burst such that the next RF burst generated by that driver will be at a more optimal frequency.

It is well-known and commonplace to program and execute imaging control functions and logic with software instructions for conventional or general purpose microprocessors, such as controller 22. Such control is taught by various prior patents and commercial products. The programming or software may of course vary depending on the particular functions, software type, and microprocessor or other computer system utilized, but will be available to, or readily programmable without undue experimentation from, functional descriptions or prior knowledge of functions which are conventional, together with general knowledge in the software and computer arts. Alternatively, the disclosed system may be implemented partially or fully in hardware, using standard logic circuits or a single chip using field programmable gate arrays (FPGAs) or custom VLSI designs.

Figure 2:
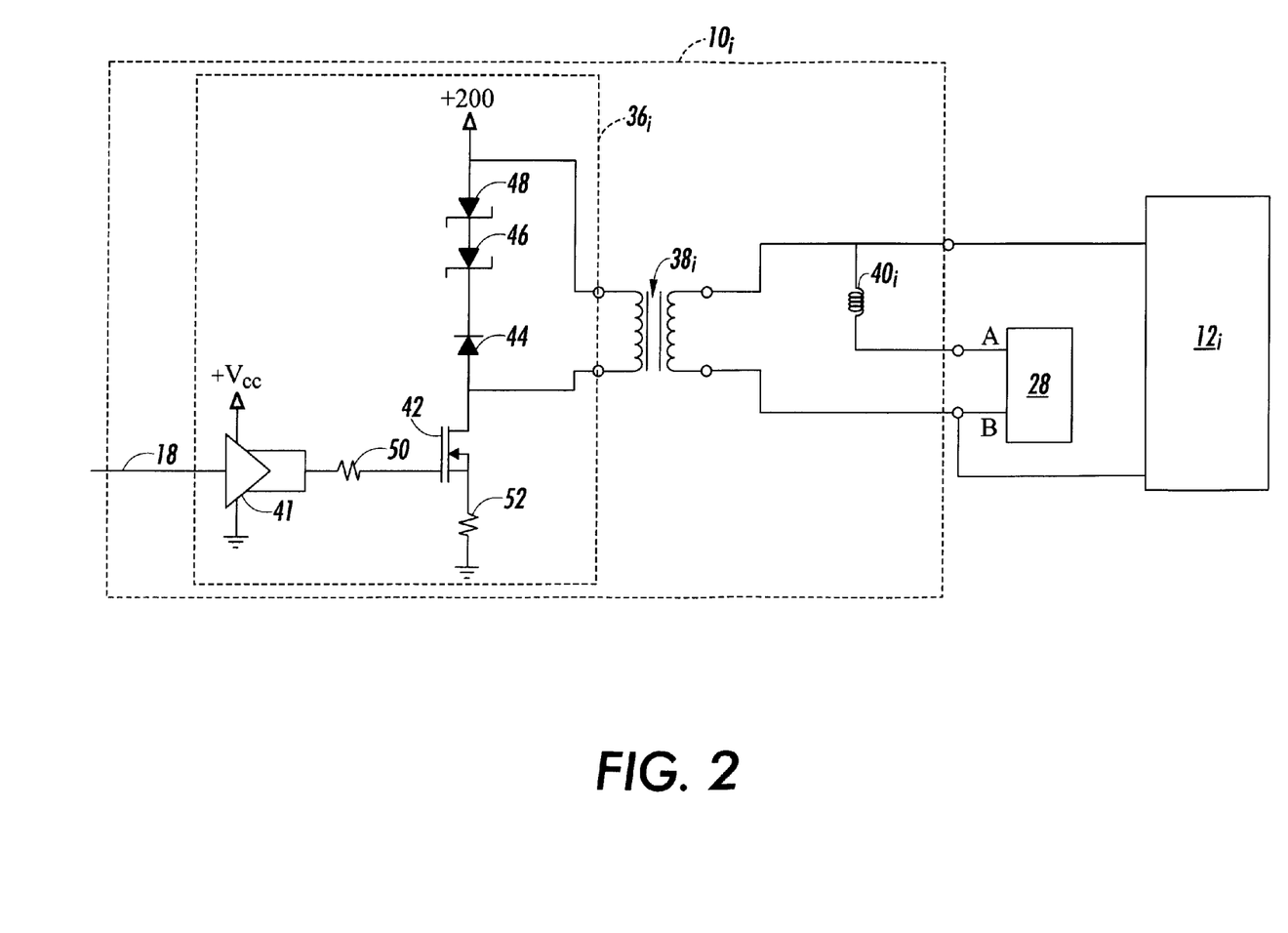
FIG. 2 illustrates an embodiment of an RF driver stage suitable for use in the present invention.

Referring now to FIG. 2, there is shown a schematic diagram of an embodiment of an RF driver stage $10_i$ suitable for use with the present invention. In the RF driver stage of FIG. 2, power driver $36_i$ is shown comprising MOSFET driver 41 coupled to the gate of common source connected MOSFET 42. The drain of MOSFET 42 is connected to the primary of transformer $38_i$ across which are connected diode 44 and transient voltage suppressors 46 and 48. MOSFET driver 41 operates as a level translator to generate an output voltage sufficient to control the gate of MOSFET 42 in response to drive pulse 18 received at the amplifier input. For each drive pulse received, MOSFET driver 41 turns on MOSFET 42 which, acting as a current sink, draws current through the primary of transformer $38_i$. Transient voltage suppressors 46 and 48 provide over-voltage protection in the event a large voltage builds up at the drain of MOSFET 42 due to transformer leakage inductance responses or transients. Diode 44 is added in series with transient voltage suppressors 46 and 48 to block the current flow directly through transient voltage suppressors 46 and 48 when MOSFET 42 is conducting, but still provide overvoltage protection during the deadbeat portion of the primary waveform when the voltage on the drain of MOSFET 42 normally rises above the supply voltage. Resistor 50 is included to prevent spurious oscillations of MOSFET 42. Resistor 52 is connected to the source of MOSFET 42 to help normalize stage to stage transconductance.

As indicated above, resonant inductor $40_i$ is coupled across the secondary of transformer $38_i$ and has an inductance chosen to resonate with external load $12_i$ at the desired operating frequency. The use of resonant inductor $40_i$, although not required for proper operation of the RF driver stage, allows the RF driver stage to obtain the inductance necessary to ensure resonance at the desired operating frequency without placing significant constraints on the design of step-up transformer $38_i$. Specifically, by including resonant inductor $40_i$, the two design goals of a small resonance inductance and a large secondary to primary turns ratio are decoupled. Transformer $38_i$ is designed with a large turns ratio with a large secondary inductance which accommodates the small leakage inductance requirement. Resonant inductor $40_i$ is then made sufficiently small such that the parallel inductance of the resonant inductor and the transformer secondary is equal to the required resonant inductance.

Figure 3:
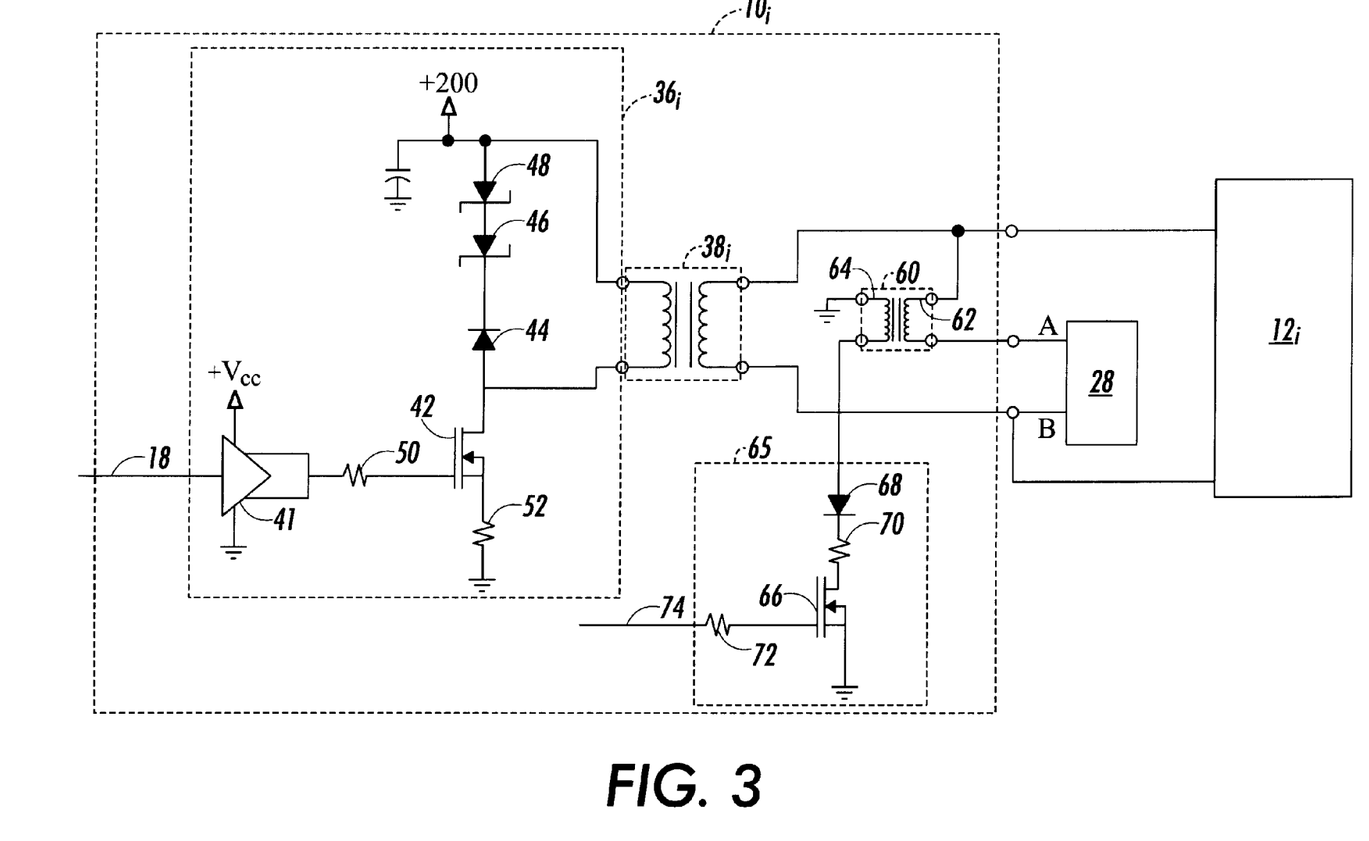
FIG. 3 is a schematic diagram of a second embodiment of an RF driver stage suitable for use in the present invention.

In FIG. 3, there is shown a schematic diagram of a second embodiment of an RF driver stage comprising power driver $36_i$, step-up transformer $38_i$, transformer 60 and quenching circuit 65. In the RF driver stage shown in FIG. 3, power driver $36_i$ and step-up transformer $38_i$ are similar to those of the RF driver stage shown in FIG. 2, and transformer 60 operates as a resonant inductor. Transformer 60 has a turns ratio similar to the inverse of transformer $38_i$, however, unlike transformer $38_i$ the leakage inductance does not have to be tightly controlled as this transformer is not used as the main energy transfer element. Primary 62 of transformer 60 is coupled across the secondary of step-up transformer $38_i$ and operates as a resonant inductor to provide a controlled inductance across the secondary of transformer $38_i$. The inductance of primary 62 is chosen to resonate with external load $12_i$ at the desired operating frequency.

Secondary 64 of transformer 60 is coupled to quenching circuit 65. Quenching circuit 65 is shown comprising common source connected MOSFET 66, diode 68 and resistors 70 and 72. The drain of MOSFET 66 is connected in series with diode 68 and resistor 70 to secondary 64 of transformer 60. A quench signal 74 is supplied to the gate of MOSFET 66 through resistor 72. When the RF driver stage is receiving drive pulses 18, quench signal 74 is not present and MOSFET 66 is off. Diode 68 prevents conduction of current through the intrinsic diode of MOSFET 66. With MOSFET 66 off, a voltage is allowed to form across secondary 64 and primary 62 acts as an inductor. If the RF driver stage is not receiving drive signal 18, quench signal 74 is present at the gate of MOSFET 66 and turns on the MOSFET. When quench signal 74 turns on MOSFET 66, a path to ground is established across secondary 64 which prevents primary 62 from maintaining a voltage potential. Quenching circuit 65 thus provides for the rapid decay of the RF signal across transformer 60 due to energy being dissipated in resistor 70 during the half cycles where diode 68 conducts. This results in a fast termination of the RF signal burst. Quenching circuit 65 also reduces the effects of cross talk between the loads by dissipating any energy introduced to the resonant tank via capacitive coupling to other driven loads.

Figure 4:
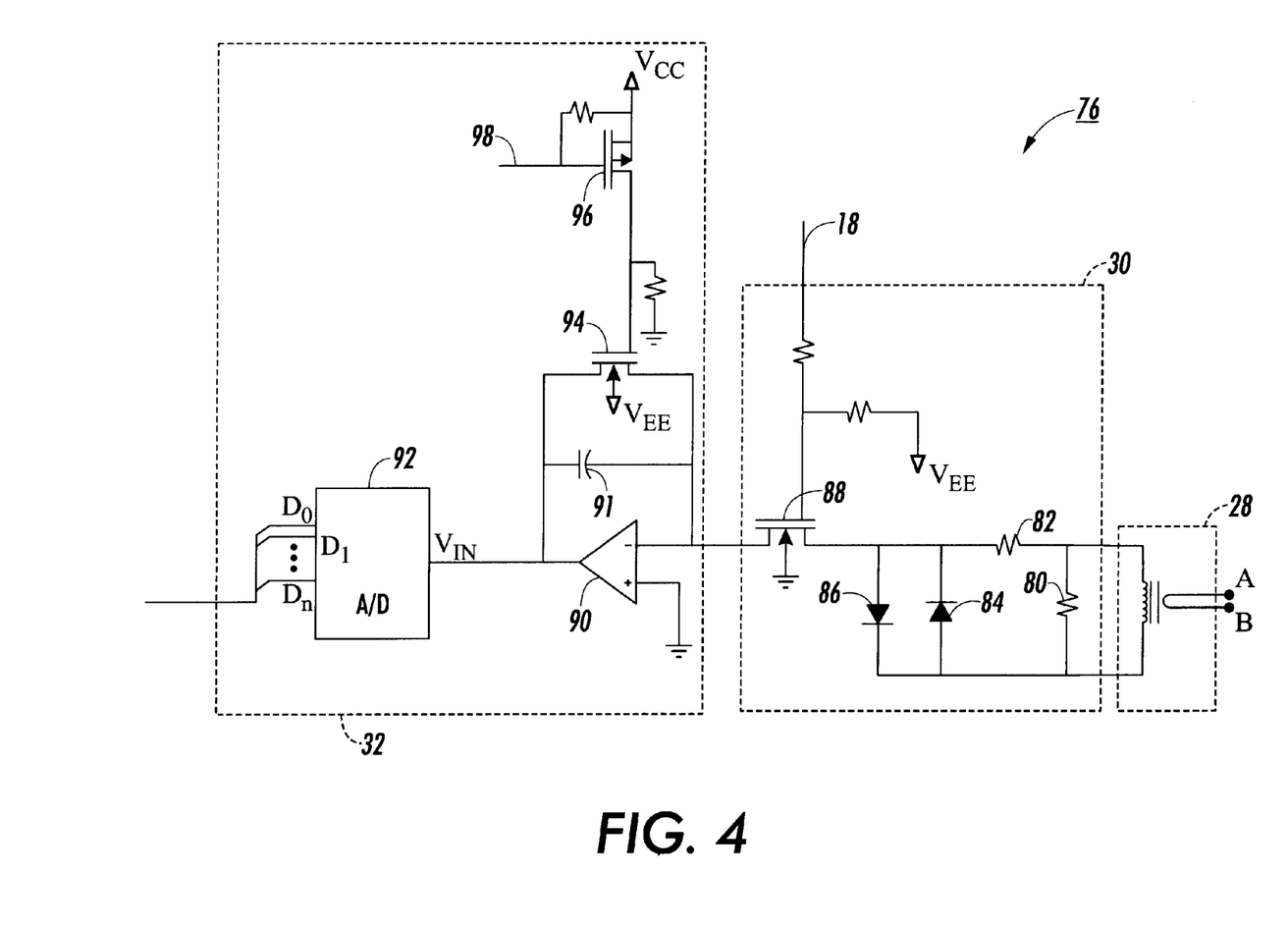
FIG. 4 illustrates one embodiment of a gated integrator feedback circuit for use in the present invention.

Referring now to FIG. 4, there is shown a schematic diagram of a gated integrator 76 in which the functions of current transformer 28, phase detector 30 and integrator 32 are incorporated into a single feedback circuit. As previously noted, the train of drive pulses 18 applied to the RF driver stage should be correlated with the phase of the current in resonant inductor $40_i$ (or transformer primary 62). When the frequency $f_{VCO}$ of the drive pulses matches the resonant frequency $f_{res}$, the current in resonant inductor $40_i$ passes through zero during application of the drive pulse to the RF driver stage. Ideally, the pulses driving the RF driver stage are symmetric about the zero crossings of the current in resonant inductor $40_i$. Identifying when the current passes through zero yields a phase error that can be used to drive $f_{VCO}$ towards $f_{res}$. Gated integrator 76 monitors the resonant current and generates an output value that corresponds to the point during the application of a drive pulse that the current in the resonant inductor passes through zero.

With continued reference to FIG. 4, current transformer 28 is coupled to RF driver stage $10_i$ in series with resonant inductor $40_i$ (transformer primary 62) across the secondary of step-up transformer $38_i$. Current transformer 28 senses the current in the resonant inductor $40_i$ and generates a reference current having the same phase as the current in the resonant inductor. Resistor 80 is coupled across transformer 28 and operates with resistor 82 and diodes 84 and 86 to generate a phase detection voltage at the source of MOSFET 88 that is proportional to the phase of the reference current.

MOSFET 88 serves as a switch at the input to amplifier 90 to control the application of the phase detection voltage to the amplifier. Drive pulse 18 is coupled to the gate of MOSFET 88. The turning on of MOSFET 88 in response to drive pulse 18 couples the voltage at the source of MOSFET 88 to amplifier 90. When the drive pulse is removed from the gate of MOSFET 88, the MOSFET turns off and the phase detection voltage is removed from the input to amplifier 90.

Activating MOSFET 88 with a drive pulse operates to gate the phase detection voltage such that the phase of the current in the resonant inductor is "sampled" only during the application of drive pulse to the RF driver stage. If drive pulse 18 controlling the gate of MOSFET 88 is taken directly from the output of modulator 16 (as shown in FIG. 1), the propagation delays associated with address decoder 18 and power driver $36_i$, which delay the arrival of the pulse at transformer $38_i$ and the current through the resonant inductor, must be considered. To remedy this, the drive pulse controlling the gate of MOSFET 88 can be taken from the output of MOSFET driver 41 (FIGS. 2 or 3). Controlling the gate of MOSFET 88 using a drive pulse from MOSFET driver 41 also ensures that the proper voltage needed to turn on MOSFET 88 is present.

Amplifier 90 and capacitor 91 combine to form an integrator which integrates the phase detection voltage signal received to provide an output voltage proportional to the integral of the input voltage. Integrating the phase detection voltage signal generated in response to the sampled current yields a value that indicates when during the application of a drive pulse the current in resonant inductor $40_i$ (primary 62) passes through zero. For example, recalling that the drive pulses ideally are centered around the zero crossings of the current in resonant inductor $40_i$, the integral of the phase detection voltage would be zero if the inductor current passes though zero when expected. However, if the current passes through zero earlier than expected, integrating the feedback voltage will result in a negative value having a magnitude that is proportional to the degree of offset from the expected zero crossing.

The output of amplifier 90 is coupled to analog to digital converter 92 which converts the analog output to a digital phase error value coupled to controller 22. A reset circuit comprising MOSFET 94 and FET 96 is connected across amplifier 90 to reset the voltage signal at the amplifier input to zero before each drive pulse 18 upon receipt of an amplifier reset pulse 98.

Assuming that the RF driver stages comprise the embodiment shown in FIG. 3 and that the functions of current transformer 28, phase detector 30 and integrator 32 are incorporated into the gated integrator of FIG. 4, the operation of driver network 5 of FIG. 1 begins with the generation of an address signal 24 for a specific RF driver stage, such as RF driver stage $10_2$, and the provision of an initial control signal 34 associated with RF driver stage $10_2$ to voltage-controlled oscillator 14. With the RF driver stages comprising the embodiment shown in FIG. 3, controller 22 also generates a quench signal (not shown) that is applied to each of the remaining RF driver stages to suppress cross talk at these drivers. Controller 22 then supplies enable signal 26 to address decoder 20.

In response to control signal 34, VCO 14 generates an oscillating signal having a frequency $f_{VCO}$. The oscillating signal is passed to pulse-width modulator 16 which produces drive signal 18 comprising a train of drive pulses having a controlled duty cycle. Decoder 20 receives drive signal 18 from modulator 16 and, while enable signal 26 is active, directs the train of drive pulse to the addressed RF driver stage $10_2$.

RF driver stage $10_2$ receives drive pulses 18 at the input to MOSFET driver 41. For each drive pulse received, MOSFET driver 41 generates an output voltage which turns on MOSFET 42. MOSFET 42 is turned on for a period of time equal to the duration of the drive pulse. When turned on, MOSFET 42 draws current through the primary of transformer $38_2$, and external load $12_2$ begins to resonate with primary 62 of transformer 60 at the desired operating frequency.

The RF driver stage continues to receive the drive pulses from decoder 20 until the number of pulses required for charge deposition have been received by the decoder. During this time, gated integrator 76 provides controller 20 with a digital phase error value that is used to regulate control signal 34 to drive $f_{VCO}$ to equal $f_{res}$. The gated integrator samples the current in primary 62 and generates a phase detection voltage signal that is proportional to the phase of the resonant current in primary 62. For each drive pulse received by power driver $36_2$, the gated integrator integrates the phase detection voltage signal to provide an output voltage proportional to the integral of the input voltage signal. The output voltage is coupled to analog to digital converter which converts the analog output voltage to the digital phase error value that is coupled to controller 22.

After the period of time required for charge deposition has lapsed (determined by counting the number of drive pulses), controller 22 removes the enable signal from decoder 20 and applies a quench signal to RF driver stage $10_2$ which quickly dissipates the RF signal. Upon removal of enable signal 26 from address decoder 20, controller 22 uses the current value of control signal 34 driving VCO 14 to update the reference control signal value associated with RF driver stage $10_2$.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. An RF driver for providing RF voltage to an external load, comprising:

a voltage-controlled oscillator having an oscillator control input, said voltage-controlled oscillator generating a drive signal having a frequency $f_{VCO}$, said frequency $f_{VCO}$ being responsive to an oscillator control signal received at said oscillator control input;

an RF driver stage having an RF driver stage input coupled to receive said drive signal and first and second RF driver stage outputs coupled across said external load, said RF driver stage generating said RF voltage at said first and second RF driver stage outputs in response to said drive signal;

a current transformer coupled between one of said first and second RF driver stage outputs and said external load, said current transformer sensing a current in a resonant circuit including said external load coupled to said RF driver stage and generating a reference current having the same phase as the sensed current;

a phase detector coupled to receive said reference current and said drive signal, said phase detector generating a phase detection signal providing a measure of the phase of said reference current with respect to said drive signal; and a controller coupled to receive said phase detection signal, said controller generating said oscillator control signal in response to said phase detection signal.

2. The device of claim 1 further including a pulse width modulator coupled to receive said drive signal, said pulse width monitor generating a series of drive pulses having a controlled pulse width independent of said frequency $f_{VCO}$, said series of drive pulses being coupled to said RF driver stage input.

3. The device of claim 2 further comprising an integrator coupled to receive said phase detection signal, said integrator integrating said phase detection signal to generate an integrated phase error.

4. The device of claim 1 wherein said RF driver stage comprises:

a step-up transformer having a primary winding and a secondary winding, said secondary winding being coupled to said external load; and a power driver having a power driver input coupled to receive said drive signal and a power driver output coupled to said primary winding.

5. The device of claim 4 wherein said RF driver stage further comprises a resonant inductance coupled to said secondary winding.

6. The device of claim 5 wherein said resonant inductance comprises:

a resonant transformer having a resonant transformer primary and a resonant transformer secondary, said resonant transformer primary being coupled to said step-up transformer secondary winding; and a quenching circuit coupled to said resonant transformer secondary.

7. The device of claim 6 wherein said power driver comprises:

a voltage suppressor;

a diode connected in series with said voltage suppressor across said step-up transformer primary winding; and a MOSFET coupled to said step-up transformer primary winding.

8. The device of claim 1 for selectively providing RF voltage to any selected one of a series of external loads, comprising:

an address decoder having first and second decoder inputs and a plurality of decoder outputs, said address decoder coupled to receive said drive signal at said first decoder input and an address signal at said second decoder input, said address decoder being responsive to said address signal to couple said drive signal to one of said plurality of decoder outputs.

9. A device for providing RF voltage to an external load, comprising:

a voltage controlled oscillator generating a drive signal having a drive frequency $f_{VCO}$;

a step-up transformer having a transformer primary and a transformer secondary, said transformer secondary coupled to said external load;

a power driver coupled to said transformer primary, said power driver drawing current through said transformer primary in response to said drive signal a resonant transformer having a first winding and a second winding, said first winding being coupled to said step-up transformer secondary; and a quenching circuit coupled to said second winding of said resonant transformer, said quenching circuit operating to provide a path to ground across said second winding when said step-up transformer is not receiving said drive signal.

10. The device of claim 9, wherein said resonant transformer, said transformer secondary and said external load form a resonant circuit and further comprising:

a current transformer coupled to said resonant circuit, said current transformer sampling the current in said resonant circuit and a phase detector coupled to said current transformer, said phase detector generating a phase detection voltage that is proportional to the phase of the sampled current.

11. The device of claim 10 further comprising an integrator coupled to said phase detector, said integrator integrating said phase detection voltage to generate a feedback voltage indicating the phase of the sampled current with respect to the frequency $f_{VCO}$ of said drive signal.

12. The device of claim 11 further comprising a controller coupled to receive said feedback voltage, said controller responsive to said feedback voltage to adjust the frequency $f_{VCO}$ of said drive signal to equal the resonant frequency of said resonant circuit.

13. The device of claim 9, wherein said resonant transformer has a turns ratio that is substantially equal to the inverse of a turns ratio of said step-up transformer.

14. The device of claim 9, wherein the primary winding of said resonant transformer is coupled to said step-up transformer secondary.

15. A printing machine in which an image is fixed to print sheets of the type including a device for providing RF drive power to a print head, comprising:

a voltage controlled oscillator generating a drive signal having a drive frequency $f_{VCO}$;

a step-up transformer having a transformer primary and a transformer secondary, said transformer secondary coupled to said print head;

a current transformer coupled between said transformer secondary and said print head, said current transformer sensing a current in a resonant circuit including said print head and said transformer secondary and generating a reference current having the same phase as the sensed current; and a phase detector coupled to receive said reference current and said drive signal, said phase detector generating a phase detection signal providing a measure of the phase of said reference current with respect to said drive signal.

16. The printing machine of claim 15, further comprising a resonant inductance coupled to said transformer secondary, wherein said resonant circuit further includes said resonant inductance and wherein said resonant inductance being selected such that said resonant circuit has a desired resonant frequency $f_{res}$.

17. The printing machine of claim 16 wherein said resonant inductance comprises a resonant transformer, said resonant transformer having a primary winding coupled to said transformer secondary.

18. The printing machine of claim 17 further comprising a controller coupled to receive said feedback voltage, said controller responsive to said feedback voltage to adjust the frequency $f_{VCO}$ of said drive signal to equal the resonant frequency of said resonant circuit.

19. The printing machine of claim 15 further comprising an integrator coupled to said phase detector, said integrator integrating said phase detection signal to generate a feedback voltage indicating the phase of the sampled current with respect to the frequency $f_{VCO}$ of said drive signal.

* * * * *